United States Patent [19]

Kwon et al.

[11] Patent Number: 5,481,252
[45] Date of Patent: Jan. 2, 1996

[54] MODE CONVERSION METHOD FOR MULTIFUNCTIONAL PROGRAMMABLE REMOTE CONTROLLER

[75] Inventors: Sun-don Kwon, Seoul; Hyeon-su Kim, Suwon, both of Rep. of Korea

[73] Assignee: SamSung Electronics Co., Ltd., Kyungki, Rep. of Korea

[21] Appl. No.: 237,912

[22] Filed: May 4, 1994

Related U.S. Application Data

[63] Continuation of Ser. No. 770,242, Oct. 3, 1991, abandoned.

[30] Foreign Application Priority Data

Oct. 26, 1990 [KR] Rep. of Korea ............. 90-17222

[51] Int. Cl.⁶ ................................. G08C 17/00
[52] U.S. Cl. .................. 340/825.22; 340/825.24; 340/825.69; 455/151.4
[58] Field of Search ............. 340/825.22, 825.24, 340/825.25, 825.56, 825.69, 825.72; 348/734; 359/142, 145, 146, 148; 455/151.1, 151.2, 151.4

[56] References Cited

U.S. PATENT DOCUMENTS

| | | | |
|---|---|---|---|
| 4,623,887 | 11/1986 | Welles, II | 359/146 |
| 4,905,279 | 2/1990 | Nishio | 340/825.72 |
| 4,918,439 | 4/1990 | Wozniak et al. | 340/825.69 |
| 5,175,538 | 12/1992 | Kurita | 340/825.72 |

FOREIGN PATENT DOCUMENTS

380371A3  1/1990  European Pat. Off. .

*Primary Examiner*—Michael Horabik
*Attorney, Agent, or Firm*—Robert E. Bushnell

[57] ABSTRACT

A mode conversion method for performing an input/output of the control data in a multifunctional programmable remote controller having multi-band remote function and learning functions, including the steps of checking for which key is selected among a mode key, a set key, and normal keys, converting to a waiting mode when the setting is not in progress if a key signal is not input, and displaying the selected mode within a certain time and converting to a using mode when the setting is in progress, then, inspecting the setting condition if the mode key is selected so that if the setting is not in progress, each mode display is toggled to indicate that the mode is converted, and if the setting is in progress, the current step returns to a key scanning step for determining whether the current mode is a using mode or a setting mode so that if it is the using mode, data is output and displayed by modes and if it is the setting mode, the mode is selected.

24 Claims, 6 Drawing Sheets

MODE CONVERSION METHOD FOR MULTIFUNCTIONAL PROGRAMMABLE REMOTE CONTROLLER

This is a continuation of application Ser. No. 07/770,242 filed 3 Oct. 1991 now abandoned.

BACKGROUND OF THE INVENTION

The present invention relates to a mode convexsion method for a multifunctional programmable remote controller for the control of household appliances, and particularly to a mode conversion method which performs input/output of control data in a multifunctional programmable remote controller that has multibrand remote control (MBR) and learning functions.

An ordinary multifunctional programmable remote controller is able to learn, store and retransmit a remote control code transmitted from the other individual remote controller in order to combine the control of a television set, a cable converter, a video cassette recorded, a video disk player and the like. The multifunctional remote controller includes an infrared receiver, a microprocessor, a memory composed of a ROM and RAM, an infrared transmitter, a liquid crystal display and a keypad for inputting the user's desired data. The application program of the microcomputer is divided into the categories of learning, storing, transmitting and user interface.

The learning function according to the microprocessor's application program must be repeated at least twice in order to precisely receive and read a signal transmitted from an ordinary remote controller. Then, when the learning function is carried out and the data is read, it is compressed to fit the capacity of the data memory for use later. The remote controller having a multi brand remote control function (MBR function) is also developed, whereby various electronic appliances (multi brand) can be controlled with a single remote controller whenever the user presses a code number of a designated product after storing an operating condition of the remote controller of the designated product according to the code numbers of various electronic appliances into the memory or a recording medium by using the conventional multifunctional remote controller as described above. However, when the remote controller having learning and MBR functions is manufactured by simply adding two functions, it becomes complicated in design and voluminous in appearance, thereby failing to meet the respective user's expectations.

SUMMARY OF THE INVENTION

Therefore, to solve the above problem, it is an object of the present invention to provide a mode conversion method for a multifunctional programmable remote controller to which an MBR function is added to control ordinary household electronic equipment by storing the applicable brand code in a programmable remote controller having a learning function capable of easily controlling a plurality of household electronic appliances, thereby satisfying a variety of users' demands.

To attain the above object of the present invention, there is provided a mode conversion method for a multifunctional programmable remote controller comprising the steps of:

converting a waiting mode of the multifunctional programmable remote controller into an operating mode, and then, scanning the input keys to detect which key among a mode key, a set key and normal keys has been pressed;

checking a present setting condition of a set key when any key signal has not been input in the above key scanning step, so that if a setting mode is not in progress, the power is turned off and the operating mode is converted back to the waiting mode, and if the setting mode is in progress, checking whether a certain time is elapsed to thereby proceed to the key scanning step if the certain time is not elapsed and turning the power off after the mode is displayed according to a current input mode and converted into a using mode if the certain time has elapsed;

checking whether a mode key has been pressed in the key scanning step, and checking the present setting condition of the set key if the mode key has been pressed, so that if the setting mode is not in progress, each mode display is toggled to indicate that a mode conversion has occurred and then the power is turned off, and if the setting mode is in progress, the procedure returns to the scanning step;

determining whether the current mode is a using mode or a setting mode if the set key has not been selected when the mode key has not been pressed in the key scanning step, so that if it is in the using mode, data is displayed in a display unit 2 by each of the modes according to whether the present mode is a multi brand remote control mode or a learning mode and the power is turned off; and if it is in the setting mode, the related data is processed and displayed according to whether the present mode is the learning mode or the multi brand remote control mode, and then are stored in a memory, and the procedure returns to the scanning step;

checking the present setting condition of the set key when the set key has been pressed in the key scanning step, so that if the setting is not in progress, each mode display is flashed for the present mode and the mode is converted into the setting mode, and the procedure returns to the key scanning step; and if setting is in progress, when the present mode is the learning mode, the result of the learning mode data setting completion is displayed in the display unit 2 and the mode is converted into the using mode and when the present mode is the multi brand remote control mode, it is checked whether the set data is valid data, whereby if it is valid, the valid data is processed and stored in the memory, and if it is not valid, the error is displayed in the display unit and the result of the multi brand remote control mode data setting completion is displayed, and the power is turned off after conversion to the using mode.

BRIEF DESCRIPTION OF THE DRAWINGS

The above object and other advantages of the present invention will becomes more apparent by describing in detail a preferred embodiment of the present invention with reference to the attached drawings in which.

DETAILED DESCRIPTION OF THE INVENTION

Figure 1:
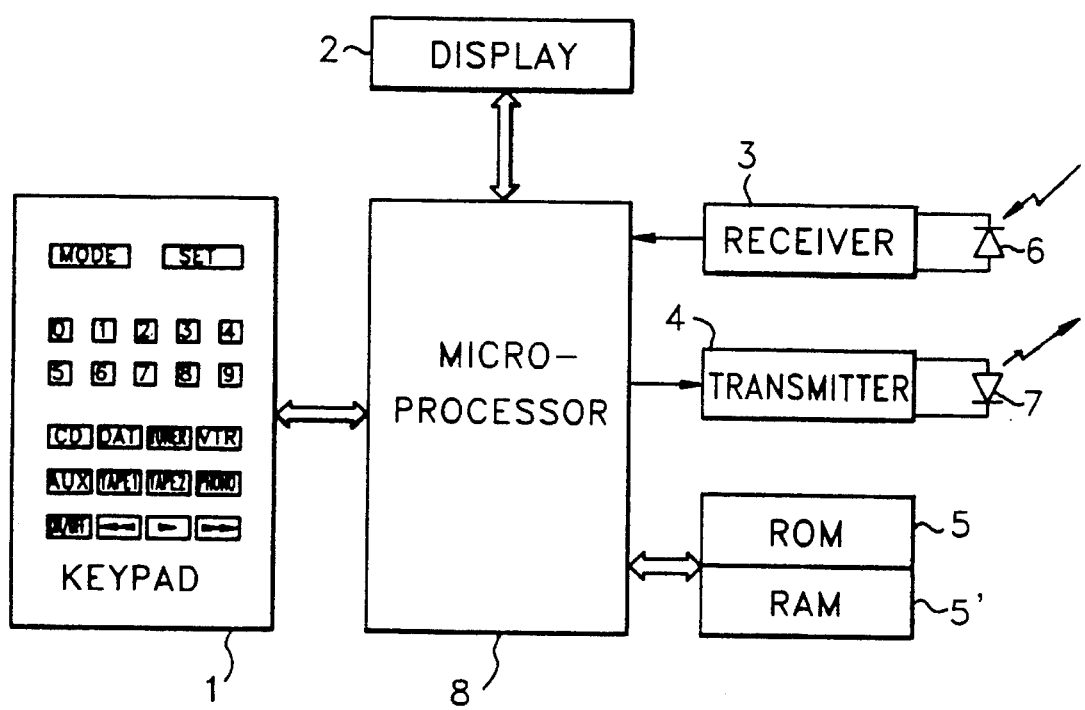
FIG. 1 is a block diagram of an apparatus for performing a mode conversion method for a multifunctional programmable remote controller according to the present invention.

Referring to FIG. 1, the apparatus for performing the mode conversion method of a multifunctional programmable remote controller according to the present invention transmits, to a microcomputer 8, a key signal selected by scanning through a key matrix circuit (not shown) the input key data supplied from the keypad 1 that is connected to a microprocessor 8. Then, the microprocessor 8 in a learning mode controls a data signal input through a light receiving device 6 connected to a receiver 3 and displays each separate function on display device 2, and stores the data in the RAM 5'. The microprocessor 8 operates application programs stored in ROM 5 in accordance with a key signal selected from keypad 1, and temporarily stores various data corresponding thereto in RAM 5'. Then, microprocessor 8, in a using mode, transmits data to the transmitter 4; and the transmitter 4 transmits the data using the light emitting device 7.

On the keypad 1, a mode key, a set key, numerical keys, function selection keys, and basic operating keys are arranged into addition a mute key, a recall key and volume adjustment keys, and so on. The key arrangement on the keypad 1 in accordance with the present invention is briefly shown in FIG. 1 for the sake of convenience. Here, the mode key is used in selecting the MBR mode or the learning mode, and the set key is used in selecting a using mode or a setting mode. The mode key and set key are toggle keys which select one mode when pressed first, and select the other mode when pressed again. The rest of the keys are normal keys which include numeric keys, function selecting keys and basic operating keys.

Figure 2A:
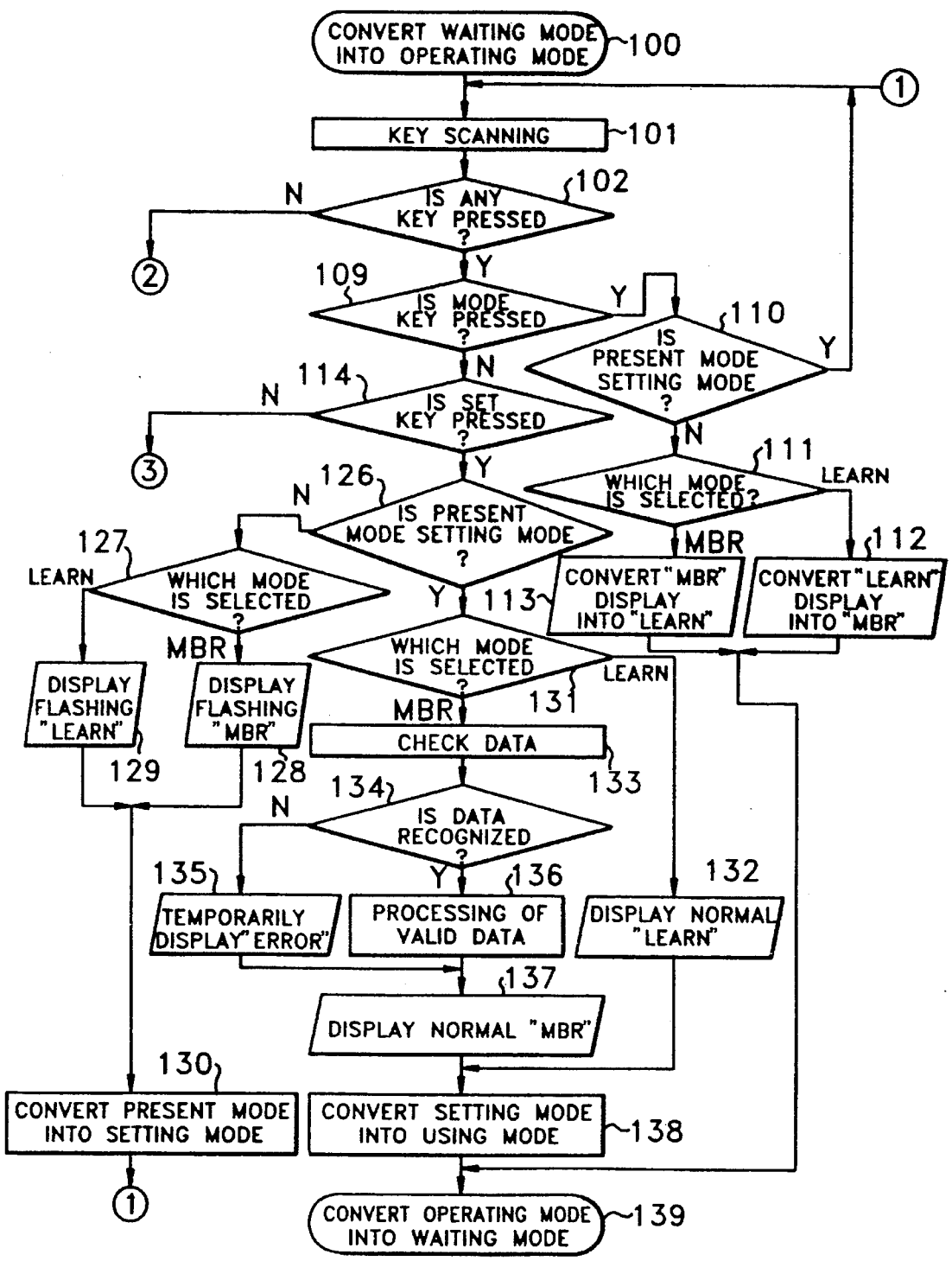
FIGS. 2A, 2B and 2C are flow charts of a program for the mode conversion method of a multifunctional programmable remote controller according to the present invention.
Figure 2B:
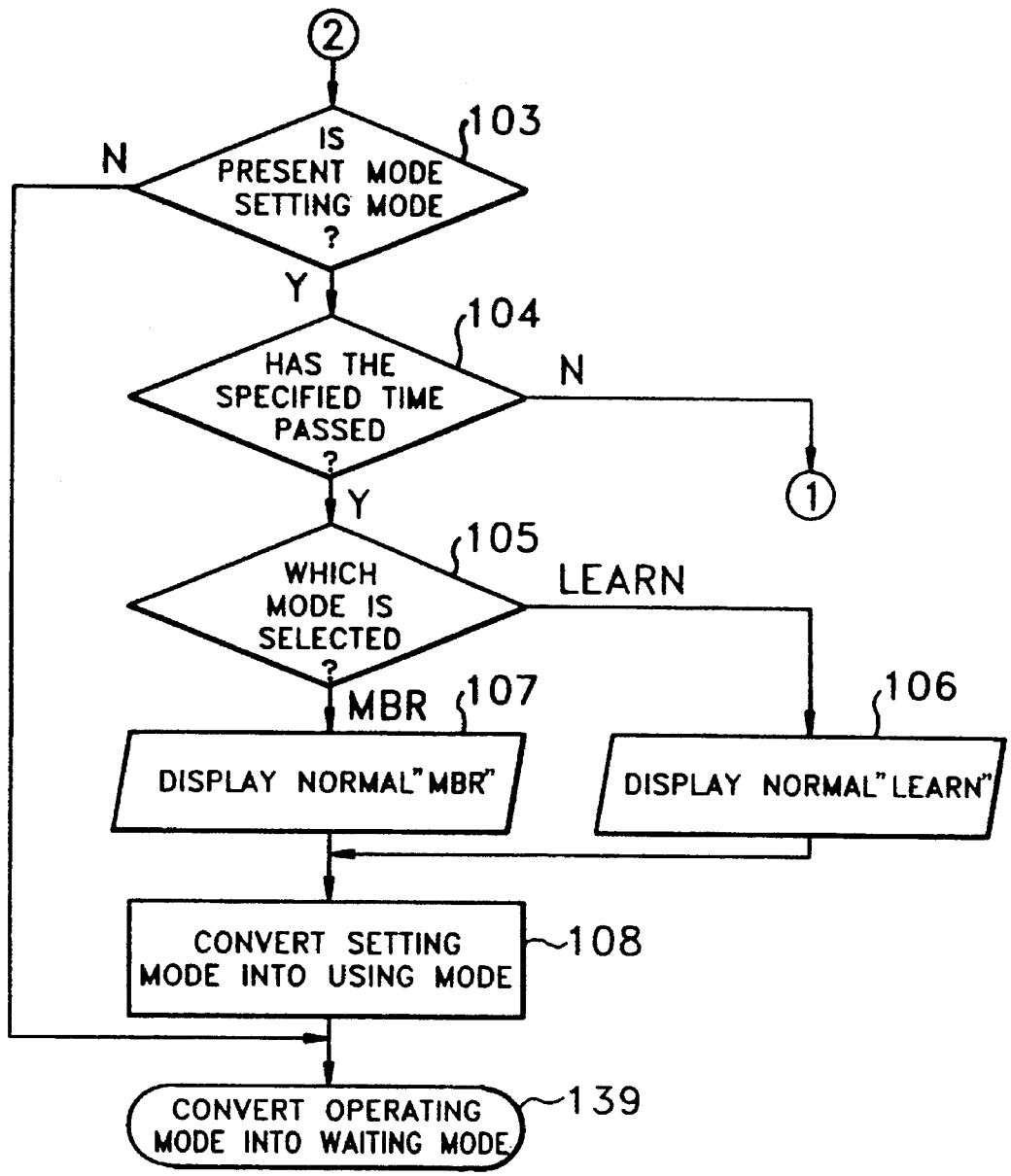
Figure 2C:
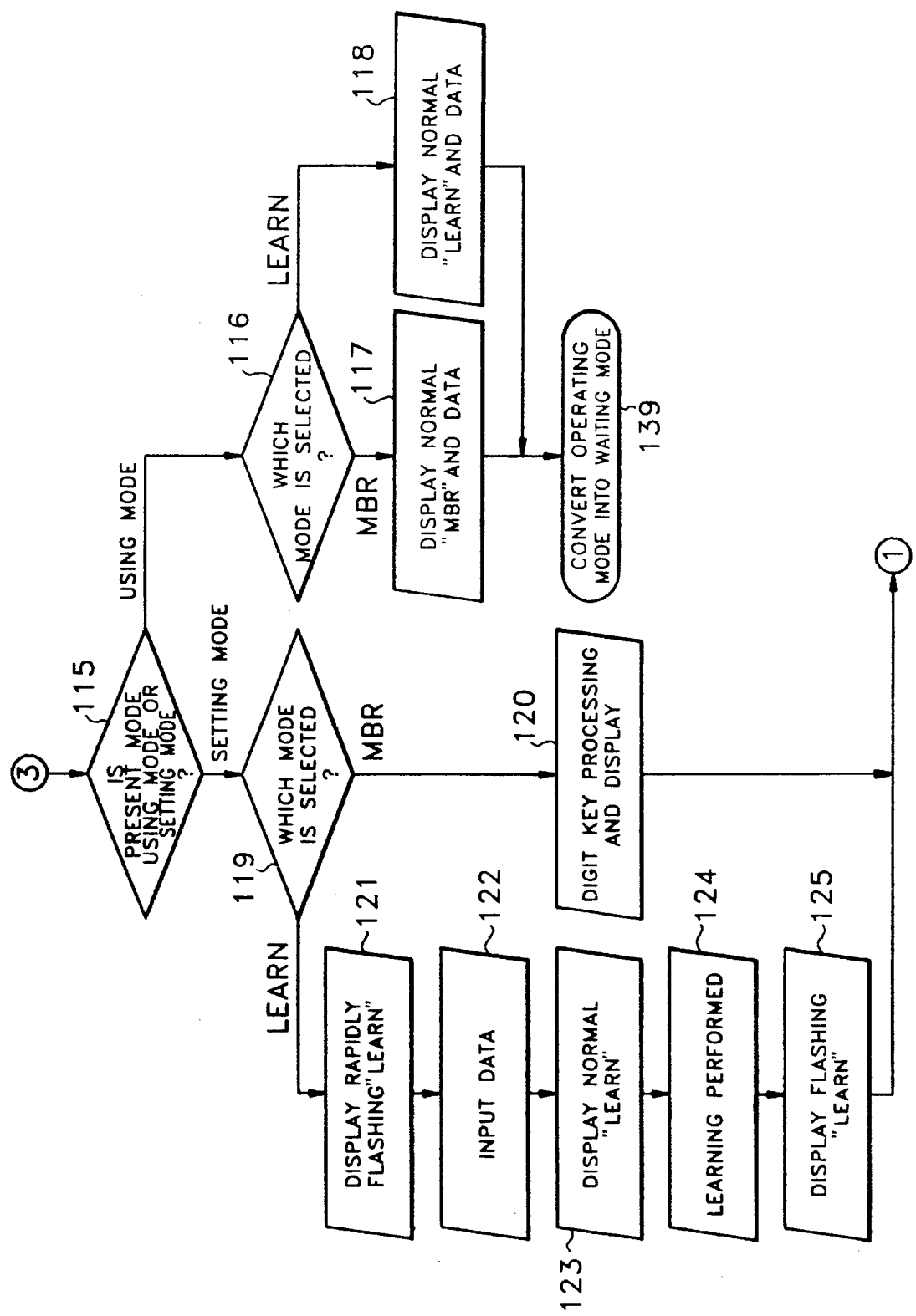

FIGS. 2A, 2B and 2C are flow charts of the mode conversion method for a multifunctional programmable remote controller according to the present invention.

Referring to FIGS. 2A, 2B and 2C, since the microprocessor 8 as shown in FIG. 1 is connected to operate when any key of the keypad 1 is pressed, when the power is turned on, to convert a waiting mode into an operating mode as shown in FIG. 2A in step 100. In step 100, the user selects a desired mode by pressing the mode key or the set key on the keypad 1 and sets the desired data according to the selected mode in the operating mode of the multifunctional programmable remote controller. If the desired data are completely set, the mode of the multifunctional programmable remote controller according to the present invention is converted into a using mode, whereby the user can control the respective household appliances. In step 100, the waiting mode is converted into the operating mode only in use, thereby minimizing a power consumption when the remote controller is not in use. After step 100, when the waiting mode is converted into the operating mode, the microprocessor 8 scans the key matrix in step 101 and checks whether a key signal has been input or not in step 102. If the key input signal was not detected in the step 102, step 103 determines whether or not the setting step is in progress as shown in FIG. 2B. If the setting step is not in progress, the power is turned off and the operating mode is converted into the waiting mode in step 139, and if the setting step is in progress, step 104 checks whether or not the specified setting time has elapsed. When a specified setting time has not elapsed in step 104, the program returns to the key scanning step 101. If the specified setting time has elapsed, the microprocessor determines which mode is selected in step 105. If a learning mode is selected as a current selected mode in step 105, the word "LEARN" is normally displayed in a display unit of step 106; and if a MBR mode is selected, "MBR" is normally displayed in the display unit 2, respectively. When steps 106 and 107 are completed and the remote controller is converted into the using mode in step 108, the power is turned off and the operating mode is converted into the waiting mode in step 139.

Meanwhile, when the key signal input condition exists in step 102, step 109 checks whether a mode key has been pressed. If step 109 determines that the mode key has been pressed, step 110 checks whether the current state of the mode key is in a setting state or not. If the setting is in progress, the microprocessor 8 returns to step 101 and scans the key matrix. If the setting is not in progress, step 111 of the microprocessor determines what mode is currently being carried out. In step 111, when the learning mode has been selected, "MBR" is displayed in step 112; and when MBR has been selected, "LEARN" is displayed in step 113. Then the power is turned off and the operating mode is converted into the waiting mode in step 139.

In step 109, when the mode key has not been pressed, step 109 goes to step 114 to determine whether or not the set key has been selected and if one of the normal keys such as the numeric keys and the function selection keys, not the set key, is selected, the microprocessor 8 determines in step 115 whether the present mode is either the using mode or the setting mode as shown in FIG. 2C. When it is determined in step 115 that the using mode has been selected, step 116 determines the state of the mode which is being carried out and if the learning mode is being carried out, or the MBR mode is being carried out, learning data or MBR data are output and displayed, respectively in step 117 or 118, and then the power is turned off and the operating mode is converted into the waiting mode in step 139. When step 115 determines that the setting mode has been selected, step 119 then determines the state of the mode which is being carried out again and if the MBR mode is being carried out, step 120 carries out a ten key process and display and then returns to the key scanning step 101. When step 119 determines that the learning mode is being carried out, the word "LEARN" is quickly flashed on the display unit 2 in step 121. When the word "LEARN" is flashed quickly in step 121, the word data are input in step 122, and when the word "LEARN" is displayed normally in step 123, the learning data is processed in step 124, then after the word "LEARN" is flashed again in step 125 the program returns to the key scanning step 101.

As illustrated in FIG. 2A, when the set key is pressed in step 114, step 126 checks whether the current state of the set key is in a setting state or not. If setting is not in progress in step 126, it checks the mode which is being carried out in step 127, and if the MBR mode is being carried out, or if the learning mode is being carried out, the word "MBR" or "LEARN" is flashed in steps 128 or 129, respectively and the microprocessor 8 returns to the key scanning step 101 after converting to the setting mode in step 130. Meanwhile, in step 126, if setting is in progress, the current mode state is again checked in step 131 and if the learning mode has been selected, "LEARN" is displayed normally in step 132. If the MBR mode has been selected in step 131, step 133 checks the data, and thereafter step 134 determines the validity of that data.

If the MBR mode data in step 134 is not valid, the word "ERROR" is displayed for a certain duration of time in step 135, and if the data is valid, it is processed in step 136. After steps 135 and 136 are processed, "MBR" is again displayed normally in step 137, After the word "LEARN" or "MBR" is displayed and processed in steps 132 and 137, respectively, a conversion to the using mode occurs in step 138, and then power is turned off and the operating mode is converted into the waiting mode in step 139.

Figure 3A:
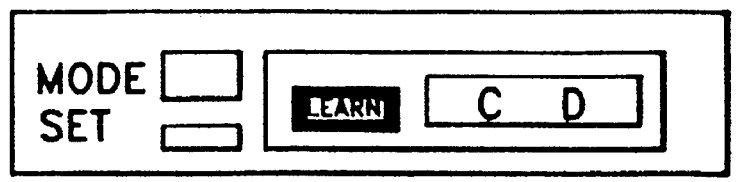
FIGS. 3A through 3G illustrate display states for performing the learning mode conversion method according to the program as shown in FIGS. 2A through 2C.
Figure 3B:
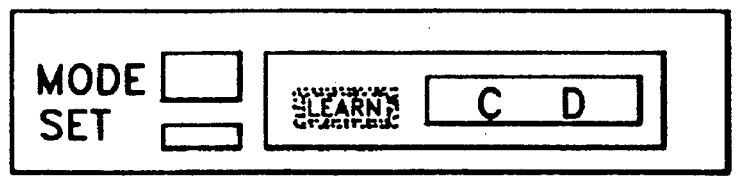
Figure 3C:
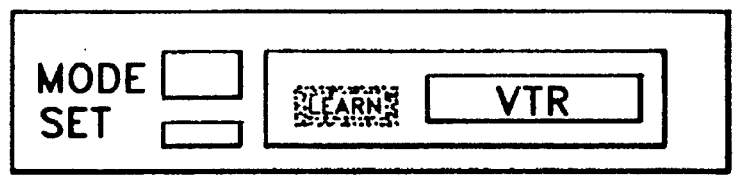
Figure 3D:
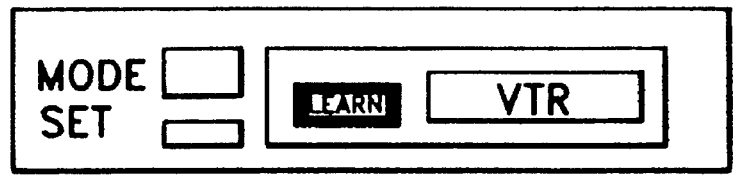
Figure 3E:
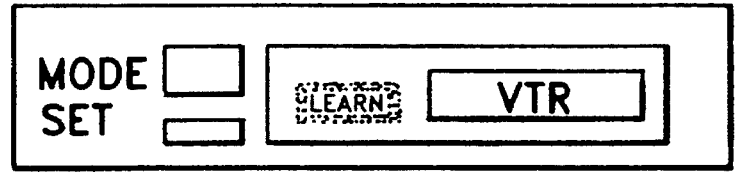
Figure 3F:
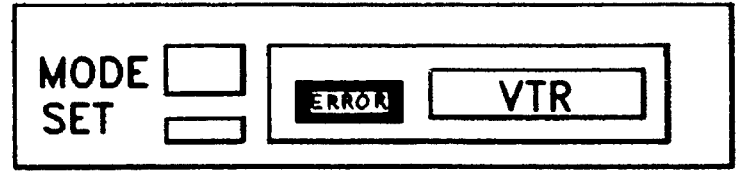
Figure 3G:
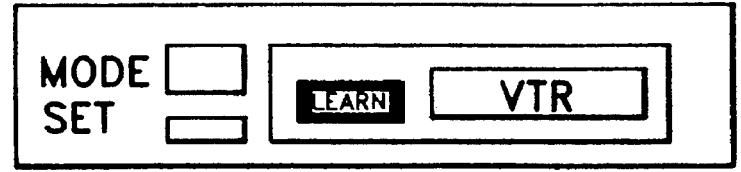

FIG. 3A through 3G illustrate the mode conversion method in the learning mode. FIG. 3A shows a case of displaying "LEARN" by means of the mode key when a multifunctional programmable remote controller controls a compact disk. When the set key is pressed in the state of FIG. 3A, the microprocessor 8 is in the learning mode and the word "LEARN" is flashed at a period of one Hz as shown in FIG. 3B. in the state as shown in FIG. 3B, the multifunctional programmable remote controller faces a remote controller to learn its program and a key position to learn is selected (For example, to control power to a VTR ). Then, when a key position is designated, a "VTR" key, being one of the function selection keys is pressed and when an "ON/OFF" key on the key matrix is pressed, the word "LEARN" is flashed at 2 Hz periods in a state as shown in FIG. 3C. When there are other states as shown in FIG. 3C, a key of other remote controller is pressed to cause the learn process and the word "LEARN" is displayed normally as shown in FIG. 3D. After the state is displayed as shown in FIG. 3D, in order to enable a completion of an input and re-learning mode, the word "LEARN" must be flashed every one Hz as shown in FIG. 3E. In order to learn another function according to the above method, the procedure is repeated from a beginning with the state as shown in FIG. 3C, and when an input error occurs after the word "ERROR" is displayed as shown in FIG. 3F, a state as shown in FIG. 3C is brought about. At this time, "ERROR" of FIG. 3F is continuously displayed for a certain time. To complete a learning process the set key is pressed, or a state as shown in FIG. 3G automatically occurs after a certain time has elapsed. To enable the output of the learned content, a key selected controlled is pressed in a state as shown in FIG. 3A.

Figure 4A:
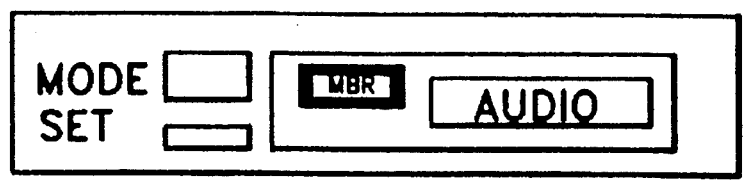
FIGS. 4A through 4D illustrate display states for performing the MBR mode conversion method according to the program as shown in FIGS. 2A through 2C.
Figure 4B:
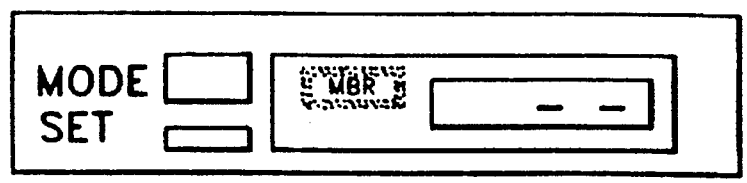
Figure 4C:
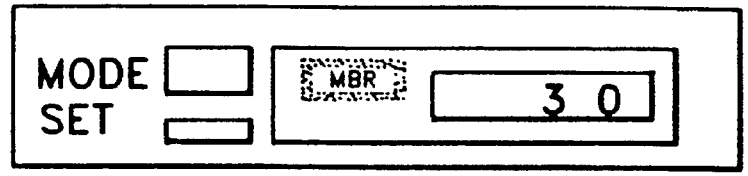
Figure 4D:
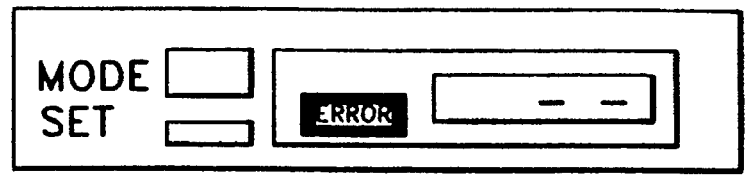

FIGS. 4A through 4D show state diagrams for performing an MBR mode conversion method. When a multifunctional remote controller controls audio equipments, the "MBR" mode is selected as shown in FIG. 4A by means of the mode key. In the state of FIG. 4A, when a set key is pressed, the word "MBR" as shown in FIG. 4B is flashed to enable an input condition for the MBR data code. At this time, if there is no input in a state as shown in FIG. 4B, the state automatically returns to that of FIG. 4A after a certain time has elapsed. If the state completed as shown in FIG. 4B, then, two digit data code for each electronic product is input as shown in FIG. 4C For example, a data code may be 30). To select a data code in FIG. 4C, a set key must be pressed to indicate an input completion. In the case of a normal code, the state is displayed as shown in FIG. 4A. At this time, should the case be that the data code of FIG. 4C is wrong, the word "ERROR" is displayed as shown in FIG. 4D, and the state returns to that of FIG. 4A after a certain time has elapsed.

As described above, the mode conversion method of the present invention can carry out not only learning function which stores the desired functions only from among numerous functions of remote controllers of a variety of electronic products but also can carry out MBR functions with a single remote controller by entering appropriate data codes to match an operating condition of a remote controller of the desired electronic appliance, thereby fulfilling user's demand for combining various functions.

While the invention has been particularly shown and described with reference to preferred embodiments thereof, it will be understood by those skilled in the art that various changes in form and details may be made therein without departing from the spirit and scope of the invention as defined by the appended claims.

What is claimed is:

1. A mode conversion method for a multifunctional programmable remote controller, comprising the steps of:

converting a waiting mode of said multifunctional programmable remote controller into an operating mode and performing a key scanning step to detect whether an input key from a key matrix is one of a mode key, a set key and normal keys;

checking a current setting condition of said set key when no input key has been detected so that when the setting condition is not in progress, the power of said multifunctional programmable remote controller is turned off and the operating mode is converted back to the waiting mode, and when said setting condition is in progress, checking whether a predetermined time has elapsed to convert the setting condition into a using mode and convert the operating mode back to the waiting mode after a selected mode is displayed according to a current mode, and returning to said key scanning step when said predetermined time has not elapsed;

checking whether said mode key has been detected in said key scanning step and determining the setting condition of said set key when said mode key has been detected so that when said setting condition is not in progress, each mode display is toggled to represent a mode conversion and the power is turned off, and that when said setting condition is in progress, returning to said key scanning step;

determining whether the current mode is one of said using mode and a setting mode when said set key has not been selected and when said mode key has not been detected in said key scanning step so that when said current mode is said using mode, corresponding data are displayed in a display unit in response to whether the current mode is one of a multi-brand remote control mode and a learning mode, and converting said operating mode back to said waiting mode and turning off the power, when said current mode is said setting mode, corresponding data are processed, displayed and stored in a memory in response to whether said current mode is one of said learning mode and said multi-brand remote control mode, and returning to said key scanning step; and checking said current setting condition of the set key when said set key has been detected in said key scanning step so that when said setting condition is not in progress, each mode display is flashed for said current mode and said current mode is converted into said setting mode before returning to said key scanning step, when said setting condition is in progress, and when said current mode is said learning mode, result of a learning mode data setting completion is displayed in the display unit and said setting mode is converted into said using mode, when said current mode is said multi-brand remote control mode, corresponding setting data are checked for validity, when said corresponding setting data is valid, the valid data are processed and stored in the memory, when said corresponding setting data is not valid, an error is displayed on said display unit and a result of said multi-brand remote control mode data setting completion is displayed, and turning off said power after converting said setting mode into said using mode.

2. A mode conversion method for a multifunctional programmable remote controller comprising a microprocessor, a keypad having a mode key, a set key and a plurality of normal keys, a receiver for receiving learning data from other remote controllers during a learning function, a ROM for storing an operating program and control code data for controlling a selected electronic appliance, a RAM for temporarily storing learning data from said receiver and said control code data from said keypad in dependence upon operations of said microprocessor, a transmitter for reading out the data stored in said ROM and RAM and transmitting the read data to said selected electronic appliance in dependence upon said microprocessor according to a key input signal of said keypad in a using mode, and a display unit for displaying an operating state in dependence upon said microprocessor, said mode conversion method comprising the steps of:

key-scanning and detecting which key is pressed among said mode key, said set key and said normal keys from said keypad in an operating mode;

when no key is pressed in said key-scanning step, directly converting the operating mode into a waiting mode if a present mode is not in a setting mode, otherwise converting the operating mode into the waiting mode after displaying of a selected mode and converting the present mode into a using mode in accordance with a present set state of said set key and a present mode state of said mode key;

returning to said key-scanning step, or proceeding to said waiting mode after converting the mode display in accordance with the present set state of said set key and the present mode state of said mode key if said mode key is pressed in said key-scanning step;

processing said control code data and said learning data and storing the processed data in said RAM in accordance with the present mode state of said mode key when said present set state is in a setting state if said set key only is pressed in said key-scanning step, then converting the present mode into said using mode after displaying the selected mode;

flashing the mode display, converting the present mode into the setting mode and returning to said key-scanning step in accordance with the present mode state of said mode key when the set key is not in the setting mode if said set key only is pressed in said key-scanning step;

determining whether the present mode of said multifunctional programmable remote controller is one of the using mode and the setting mode when the input key is one of said normal keys in said key-scanning step, then displaying data and modes in said display unit and proceeding to the waiting mode in accordance with the present mode state of said mode key; and inputting data by modes, storing the input data in said RAM and flashing said data and said modes in the display unit in accordance with the present mode state of said mode key if the present mode of said multifunctional programmable remote controller is in the setting mode when the input key is one of said normal keys, and returning to said key-scanning step.

3. The mode conversion method for a multifunctional programmable remote controller as claimed in claim 2, wherein a mode selected by said mode key is one of a learning mode and a multi-brand remote control mode, and said mode key is toggled so that said learning mode is converted into said multi-brand remote control mode, or alternatively said multi-brand remote control mode is convened into said learning mode, whenever said mode key is pressed.

4. The mode conversion method for a multifunctional programmable remote controller as claimed in claim 2, wherein a mode selected by said set key is one of the setting mode for setting said multifunctional programmable remote controller by the user and the using mode for controlling said selected electronic appliance.

5. The mode conversion method for a multifunctional programmable remote controller as claimed in claim 2 further comprising the steps of key-processing and storing key data in said RAM, displaying said data and modes normally in said display unit when the present mode key is in a multi-brand remote control mode when said normal key is pressed and a present set key is in the setting mode in said key-scanning step, and quickly flashing the mode display and normally displaying the mode display by inputting learning data, storing processed learning data in said RAM, flashing the learning mode display, and then returning to said key-scanning step, when the present mode key is in a learning mode.

6. A mode conversion method for a multifunctional programmable remote controller, comprising the steps of:

converting a waiting mode of said multifunctional programmable remote controller into an operating mode for enabling detection of whether an input key from a key matrix has been entered is one of a mode key, a set key and function selection keys;

turning off power of said multifunctional programmable remote controller by reconverting the operation mode back into the waiting mode, if the input key has not been entered for a predetermined time period, after the conversion of said waiting mode of said multifunctional programmable remote controller into said operating mode;

turning off power of said multifunctional programmable remote controller by reconverting the operation mode back into the waiting mode, after determining that a current mode is not a setting mode, if the input key is said mode key, for displaying of one of a "LEARN" mode and a "MULTIBRAND" remote control mode on a display screen;

turning off power of said multifunctional programmable remote controller by reconverting the operation mode back into the waiting mode, after determining that the current mode is the setting mode, if the input key is said set key, for displaying one of a "LEARN" mode and a "MULTIBRAND" remote control mode on the display screen;

converting the current mode of said multifunctional programmable remote controller into the setting mode and returning to the detection of the input key, after displaying one of a flashing "LEARN" mode and a flashing "MULTIBRAND" remote control mode on the display screen, if the current mode is not the setting mode, when the input key is said set key;

turning off power of said multifunctional programmable remote controller by reconverting the operation mode back into the waiting mode, after determining that the current mode is a using mode, if the input key is the function selection keys, for displaying one of said "LEARN" mode and said "MULTIBRAND" remote control mode; and returning to the detection of the input key after displaying one of said "MULTIBRAND" remote control mode and a succession of a rapidly flashing "LEARN" mode, said "LEARN" mode and said flashing "LEARN" mode, after determining that the current mode is the setting mode if the input key is the function selection keys.

7. The mode conversion method for a multifunctional programmable remote controller as claimed in claim 6, wherein said step of reconverting the operation mode back into the waiting mode if said input key has not been entered for a predetermined time period, comprises the steps of:

determining whether the current mode is the setting mode;

checking whether said predetermined time period has passed if the current mode is the setting mode;

returning to the detection of the input key if said predetermined time period has not passed;

displaying one of said "LEARN" mode and said "MULTIBRAND" remote control mode if said predetermined time period has passed;

converting the setting mode into the using mode and then reconverting the operation mode back into the waiting mode; and reconverting the operation mode back into the waiting mode if the current mode is not the setting mode.

8. The mode conversion method for a multifunctional programmable remote controller as claimed in claim 7, wherein said step of reconverting the operation mode back into the waiting mode after determining that the current mode is the setting mode if the input key is said set key, comprises the steps of:

determining whether the current mode is the setting mode;

checking whether the "MULTIBRAND" remote control mode has been selected;

checking whether a user enters multibrand data after said "MULTIBRAND" remote control mode has been selected;

temporarily displaying an "ERROR" on the display screen if the multibrand data is invalid;

displaying said "MULTIBRAND" remote control mode on the display screen if the multibrand data is valid; and converting the setting mode into the using mode and then reconverting the operation mode back into the waiting mode.

9. The mode conversion method for a multifunctional programmable remote controller as claimed in claim 6, wherein said step of returning to the detection of the input key after displaying one of said "MULTIBRAND" remote control mode and a succession of a rapidly flashing "LEARN" mode, said "LEARN" mode and said flashing "LEARN" mode comprises the steps of:

checking whether one of the "MULTIBRAND" remote control mode and the "LEARN" mode has been selected;

processing each of said function selection keys for displaying said "MULTIBRAND" remote control mode on the display screen and returning to the detection of said input key if the "MULTIBRAND" remote control mode has been selected;

displaying said rapid flashing "LEARN" mode if said "LEARN" mode has been selected;

checking whether a user enters learning data after said "LEARN" mode has been selected;

displaying the "LEARN" mode on the display screen if the learning data is valid;

processing the learning data and displaying said flashing "LEARN" mode on the display screen; and returning to the detection of the input key.

10. The mode conversion method for a multifunctional programmable remote controller as claimed in claim 6, wherein said using mode is applied to control a selected electronic appliance by a user.

11. The mode conversion method for a multifunctional programmable remote controller as claimed in claim 10, wherein said setting mode is applied to set said multifunctional programmable remote controller by a user to correspond to a selected electronic appliance.

12. A multifunctional programmable remote controller, comprising:

keypad means having a mode key, a set key and a plurality of function selection keys;

receiver means for receiving learning data from other remote controllers during a learning function;

first memory means for storing an operating program and data representative of format structures and functions of a plurality of respective electronic appliances;

second memory means for temporarily storing learning data from said receiver means and control code data for controlling a selected electronic appliance from said keypad means;

transmitter means responsive to said learning data and said control code data, for transmitting controlled data representative of said control code data and said learning data to said selected electronic appliance in accordance with a key input of said keypad means in a using mode;

display means for displaying an operating state; and processor means responsive to said keypad means, for enabling a mode conversion to perform the learning function and a multibrand remote control function by controlling said receiver means, said transmitter means, said first and second memory means and said display means, said processor means performing said learning function and said multibrand remote control function by:

converting a waiting mode of said multifunctional programmable remote controller into an operating mode and enabling detection of whether an input key from said keypad means has been entered is one of a mode key, a set key and function selection keys;

turning off power of said multifunctional programmable remote controller by reconverting the operation mode back into the waiting mode, if the input key has not been entered for a predetermined time period after the conversion of said waiting mode into said operating mode;

turning off power of said multifunctional programmable remote controller by reconverting the operation mode back into the waiting mode, after determining that a current mode is not a setting mode, when the input key is said mode key, for displaying one of a "LEARN" mode and a "MULTIBRAND" remote control mode on said display means, said "LEARN" mode and said "MULTIBRAND" remote control mode representing said learning function and said multibrand remote control function, respectively;

turning off power of said multifunctional programmable remote controller by reconverting the operation mode back into the waiting mode, after determining that a current mode is a setting mode, when the input key is said set key, for displaying one of said "LEARN" mode and said "MULTIBRAND" remote control mode on said display means;

converting the current mode of said multifunctional programmable remote controller into the setting mode and returning to the detection of the input key after displaying one of a flashing "LEARN" mode and a flashing "MULTIBRAND" remote control mode on said display means, if the current mode is not the setting mode, when the input key is said set key;

turning off power of said multifunctional programmable remote controller by reconverting the operation mode back into the waiting mode, after determining that the current mode is a using mode, when the input key is the function selection keys, for displaying one of said "LEARN" mode and said "MULTIBRAND" remote control mode on said display means; and returning to the detection of the input key after determining that the current mode is the setting mode and displaying one of said "MULTIBRAND" remote control mode and a succession of a rapidly flashing "LEARN" mode, said "LEARN" mode and said flashing "LEARN" mode, when the input key is the function selection keys.

13. The multifunctional programmable remote controller as claimed in claim 12, wherein said processor means reconverts the operation mode back into the waiting mode when said input key has not been entered for a predetermined time period by:

determining whether the current mode is the setting mode;

checking whether said predetermined time period has passed when the current mode is the setting mode;

returning to the detection of the input key when said predetermined time period has not passed;

displaying one of said "LEARN" mode and said "MULTIBRAND" remote control mode when said predetermined time period has passed;

converting the setting mode into the using mode and then reconverting the operation mode back into the waiting mode; and reconverting the operation mode back into the waiting mode when the current mode is not the setting mode.

14. The multifunctional programmable remote controller as claimed in claim 13, wherein said processor means reconverts the operation mode back into the waiting mode, after determining that a current mode is a setting mode when the input key is said set key by:

determining whether the current mode is the setting mode;

checking whether the "MULTIBRAND" remote control mode has been selected;

checking whether a user enters multibrand data after said "MULTIBRAND" remote control mode has been selected;

temporarily displaying an "ERROR" on said display means when the multibrand data is invalid;

displaying said "MULTIBRAND" remote control mode on said display means when the multibrand data is valid; and converting the setting mode into the using mode and then reconverting the operation mode back into the waiting mode.

15. The multifunctional programmable remote controller as claimed in claim 14, wherein said processor means returns to the detention of the input key after displaying one of said "MULTIBRAND" remote control mode and a succession of a rapidly flashing "LEARN" mode, said "LEARN" mode and said flashing "LEARN" mode by:

checking whether one of the "MULTIBRAND" remote control mode and the "LEARN" mode has been selected;

processing each of said function selection keys for displaying said "MULTIBRAND" remote control mode on said display means and returning to the detection of said input key when the "MULTIBRAND" remote control mode has been selected;

displaying said rapid flashing "LEARN" mode on said display means when said "LEARN" mode has been selected;

checking whether a user enters learning data after said "LEARN" mode has been selected;

displaying the "LEARN" mode on said display means when the learning data is valid;

processing the learning data and displaying said flashing "LEARN" mode on the display means; and returning to the detection of the input key.

16. The multifunctional programmable remote controller as claimed in claim 15, wherein said using mode is applied via said keypad means by a user to control a selected electronic appliance, and said setting mode is applied via said keypad means by the user to set said multifunctional programmable remote controller to correspond to said selected electronic appliance.

17. A mode conversion method for performing a learning function and a multibrand remote control function of a multifunctional programmable remote controller, comprising the steps of:

detecting whether an input key from a keypad is one of a mode key, a set key and function selection keys upon initialization of said multifunctional programmable remote controller to an operation mode;

turning off power of said multifunctional programmable remote controller and converting said operation mode of said multifunctional programmable remote controller into a waiting mode, when the input key has not been entered after a predetermined time period;

turning off power of said multifunctional programmable remote controller and converting the operation mode into the waiting mode, after determining that a current mode is not a setting mode, when the input key is said mode key, for enabling a visual display of one of a "LEARN" mode and a "MULTIBRAND" remote control mode on a display screen;

turning off power of said multifunctional programmable remote controller and converting the operation mode into the waiting mode, after determining that the current mode is the setting mode, when the input key is said set key, for enabling a visual display of one of a "LEARN" mode and a "MULTIBRAND" remote control mode on said display screen;

converting the current mode of said multifunctional programmable remote controller into the setting mode and returning to the detection of the input key after displaying one of a flashing "LEARN" mode and a flashing "MULTIBRAND" remote control mode on said display screen, if the current mode is not the setting mode, when the input key is said set key;

turning off power of said multifunctional programmable remote controller and convening the operation mode into the waiting mode, after determining that the current mode is a using mode, if the input key is the function selection keys, for enabling a visual display of one of said "LEARN" mode and said "MULTIBRAND" remote control mode on said display screen; and returning to the detection of the input key after displaying one of said "MULTIBRAND" remote control mode and a succession of a rapidly flashing "LEARN" mode, said "LEARN" mode and said flashing "LEARN" mode, after determining that the current mode is the setting mode, if the input key is the function selection keys.

18. The mode conversion method as claimed in claim 17, wherein the operation mode is converted into the waiting mode when said input key has not been entered for a predetermined time period by the steps of:
   determining whether the current mode is the setting mode;
   checking whether said predetermined time period has passed when the current mode is the setting mode;
   returning to the detection of the input key when said predetermined time period has not passed;
   displaying one of said "LEARN" mode and said "MULTI-BRAND" remote control mode on said display screen when said predetermined time period has passed;
   converting the setting mode into the using mode and then reconverting the operation mode back into the waiting mode; and
   reconverting the operation mode back into the waiting mode when the current mode is not the setting mode.

19. The mode conversion method as claimed in claim 17, wherein the operation mode is converted into the waiting mode, after determining that a current mode is a setting mode when the input key is said set key by:
   determining whether the current mode is the setting mode;
   checking whether the "MULTIBRAND" remote control mode has been selected;
   checking whether a user enters multibrand data after said "MULTIBRAND" remote control mode has been selected;
   temporarily displaying an "ERROR" on said display screen when the multibrand data is invalid;
   displaying said "MULTIBRAND remote control mode on said display screen when the multibrand data is valid; and
   converting the setting mode into the using mode and then reconverting the operation mode back into the waiting mode.

20. The mode conversion method as claimed in claim 17, wherein said step of returning to the detection of the input key after displaying one of said "MULTIBRAND" remote control mode and a succession of a rapidly flashing "LEARN" mode, said "LEARN" mode and said flashing "LEARN" mode comprises the steps of:
   checking whether one of the "MULTIBRAND" remote control mode and the "LEARN" mode has been selected;
   processing each of said function selection keys for displaying said "MULTIBRAND" remote control mode on said display screen and returning to the detection of said input key when the "MULTIBRAND" remote control mode has been selected;
   displaying said rapid flashing "LEARN " mode on said display screen when said "LEARN" mode has been selected;
   checking whether a user enters learning data after said "LEARN" mode has been selected;
   displaying the "LEARN mode on said display screen when the learning data is valid;
   processing the learning data and displaying said flashing "LEARN" mode on the display screen; and
   returning to the detection of the input key.

21. The mode conversion method as claimed in claim 17, wherein said using mode is applied by a user to control a selected electronic appliance, and said setting mode is applied by said user to set said multifunctional programmable remote controller to correspond to said selected electronic appliance.

22. A remote control apparatus, comprising:
   a keypad comprising a mode key, a set key and a plurality of normal keys, said mode key representing one of a multi-brand mode and a learn mode, said set key representing a using mode and a setting mode enabling a user to reconfigure the remote control apparatus to remotely control a plurality of electric appliances manufactured by different manufacturers by entering coded control data to match operations of said plurality of electric appliances via said normal keys when said remote control apparatus is in said multi-brand mode, and enabling the user to reconfigure the remote control apparatus to learn a plurality of functions of a selected appliance from said plurality of electric appliances via said normal keys when said remote control apparatus is in said learn mode;
   a receiver for receiving learning data and coded control data from said plurality of electric appliances during said learn mode and said multi-brand mode, respectively;
   a first memory for permanently storing different code formats for all functions of each electric appliance of said plurality of electric appliances to be controlled by said remote control apparatus;
   a second memory for temporarily storing said learning data and said control code data entered by the user via said normal keys corresponding to the code formats and functions of said plurality of electric appliances to be controlled by said remote control apparatus, when said remote control apparatus is in the setting mode;
   a transmitter responsive to said learning data and said control code data stored in said second memory, for transmitting controlled data representative of said control code data and said learning data to remotely control operation of said selected appliance from said plurality of electric appliances via said normal keys, when said remote control apparatus is in said using mode;
   a display unit for displaying operational mode of said remote control apparatus in one of said multi-brand mode and said learn mode; and
   processor means connected to said display unit, said receiver, said transmitter, said first and second memories and said keypad, for controlling said operation mode of said remote control apparatus in said multi-brand mode and said learn mode, processing said learning data and said control code data entered by the user via said normal keys for storage in said second memory when said remote control apparatus is in the setting mode, and processing said controlled data representative of said control code data and said learning data for transmission via said transmitter to remotely control operation of said selected appliance from said plurality of electric appliances when said remote control apparatus is in said using mode, said processor means converting the operational mode of said remote control apparatus between said multi-brand mode and said learn mode by:
      detecting whether an input key from said keypad entered by the user is said mode key;
      determining whether said remote control apparatus is in the setting mode, when said input key is said mode key;
      determining whether the operational mode of said remote control apparatus is one of said learn mode and said multi-brand mode displayed on said display unit, when said remote control apparatus is not in the setting mode;

converting said learn mode displayed on said display unit into said multi-brand mode when the operational mode is in said learn mode, and converting said multi-brand mode displayed on said display unit into said learn mode when the operational mode is in said multi-brand mode; and converting the operational mode of said remote control apparatus into a waiting mode and turning off power.

23. A remote control apparatus, comprising:

a keypad comprising a mode key, a set and a plurality of normal keys, said mode key representing one of a multi-brand mode and a learn mode, said set key representing a using mode and a setting mode enabling a user to reconfigure the remote control apparatus to remotely control a plurality, of electric appliances manufactured by different manufacturers by entering coded control data to match operations of said plurality of electric appliances via said normal keys when said remote control apparatus is in said multi-brand mode, and enabling the user to reconfigure the remote control apparatus to learn a plurality of functions of a selected appliance from said plurality of electric appliances via said normal keys when said remote control apparatus is in said learn mode;

a receiver for receiving learning data and coded control data from said plurality of electric appliances during said learn mode, and said multi-brand mode, respectively;

a first memory for permanently storing different code formats for all functions of each electric appliance of said plurality of electric appliances to be controlled by said remote control apparatus;

a second memory for temporarily storing said learning data and said control code data entered by the user via said normal keys corresponding to the code formats and functions of said plurality of electric appliances to be controlled by said remote control apparatus, when said remote control apparatus is in the setting mode;

a transmitter responsive to said learning data and said control code data stored in said second memory, for transmitting controlled data representative of said control code data and said learning data to remotely control operation of said selected appliance from said plurality of electric appliances via said normal keys, when said remote control apparatus is in said using mode;

a display unit for displaying an operational mode of said remote control apparatus in one of said multi-brand mode and said learn mode; and processor means connected to said display unit, said receiver, said transmitter, said first and second memories and said keypad, for controlling said operational mode of said remote control apparatus in said multi-brand mode and said learn mode, processing said learning data and said control code data entered by the user via said normal keys for storage in said second memory when said remote control apparatus is in the setting mode, and processing said controlled data representative of said control code data and said learning data for transmission via said transmitter to remotely control operation of said selected appliance from said plurality of electric appliances when said remote control apparatus is in said using mode, said processor means processing said learning data and said control code data entered by the user via said normal keys for storage in said second memory when said remote control apparatus is in the setting mode by:

detecting whether an input key from said keypad entered by the user is said set key;

determining whether said remote control apparatus is in the setting mode, when said input key is said set key;

determining whether the operational mode of said remote control apparatus is one of said learn mode and said multi-brand mode displayed on said display unit, when said remote control apparatus is in the setting mode;

flashing one of said learn mode and said multi-brand mode displayed on said display unit indicating that said remote control apparatus is set to receive learning data of a new function, when the operational mode is one of said learn mode and said multi-brand mode, respectively, and when said remote control apparatus is not in the setting mode; and displaying and processing said learning data and said control code data entered by the user via said normal keys for storage in said second memory, when the operational mode is one of said learn mode and said multi-brand mode, respectively, and when said remote control apparatus is in the setting mode; and converting the setting mode of said remote control apparatus into the using mode and converting the operational mode into a waiting mode and turning off power.

24. A remote control apparatus, comprising:

a keypad comprising a mode key, a set and plurality of normal keys, said mode key representing one of a multi-brand mode and a learn mode, said set key representing a using mode and a setting mode enabling a user to reconfigure the remote control apparatus to remotely control a plurality of electric appliances manufactured by different manufacturers by entering coded control data to match operations of said plurality of electric appliances via said normal keys when said remote control apparatus is in said multi-brand mode, and enabling the user to reconfigure the remote control apparatus to learn a plurality of functions of a selected appliance from said plurality of electric appliances via said normal keys when said remote control apparatus is in said learn mode;

a receiver for receiving learning data and coded control data from said plurality of electric appliances during said learn mode and said multi-brand mode, respectively;

a first memory for permanently storing different code formats for all functions of each electric appliance of said plurality of electric appliances to be controlled by said remote control apparatus;

a second memory for temporarily storing said learning data and said control code data entered by the user via said normal keys corresponding to the code formats and functions of said plurality of electric appliances to be controlled by said remote control apparatus, when said remote control apparatus is in the setting mode;

a transmitter responsive to said learning data and said control code data stored in said second memory, for transmitting controlled data representative of said control code data and said learning data to remotely control operation of said selected appliance from said plurality of electric appliances via said normal keys, when said remote control apparatus is in said using mode;

a display unit for displaying an operational mode of said remote control apparatus in one of said multi-brand mode and said learn mode; and processor means connected to said display unit, said receiver, said transmitter, said first and second memories and said keypad, for controlling said operational mode of said remote control apparatus in said multi-brand mode and said learn mode, processing said learning data and said control code data entered by the user via said normal keys for storage in said second memory when said remote control apparatus is in the setting mode, and processing said controlled data representative of said control code data and said learning data for transmission via said transmitter to remotely control operation of said selected appliance from said plurality of electric appliances when said remote control apparatus is in said using mode, said processor means converting the operational mode of said remote control apparatus between said multi-brand mode and said learn mode by:

determining whether said remote control apparatus is in the setting mode when an input key from said keypad entered by the user is said mode key;

determining whether the operational mode of said remote control apparatus is one of said learn mode and said multi-brand mode displayed on said display unit, when said remote control apparatus is not in the setting mode;

converting said learn mode displayed on said display unit into said multi-brand mode when the operational mode is in said learn mode, and converting said multi-brand mode displayed on said display unit into said learn mode when the operational mode is in said multi-brand mode; and converting the operational mode of said remote control apparatus into a waiting mode and turning off power, when said input key from said keypad has not been entered by the user for a predetermined time period.

* * * * *